[12] United States Patent
Nakaya et al.

(10) Patent No.: US 10,699,929 B2
(45) Date of Patent: Jun. 30, 2020

(54) CONTROLLER OF TRANSFER DEVICE

(71) Applicant: KAWASAKI JUKOGYO KABUSHIKI KAISHA, Kobe-shi, Hyogo (JP)

(72) Inventors: Atsushi Nakaya, Akashi (JP); Hiroyuki Okada, Kakogawa (JP); Masaya Yoshida, Himeji (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 283 days.

(21) Appl. No.: 15/532,693

(22) PCT Filed: Dec. 26, 2014

(86) PCT No.: PCT/JP2014/006514
§ 371 (c)(1),
(2) Date: Jun. 2, 2017

(87) PCT Pub. No.: WO2016/103310
PCT Pub. Date: Jun. 30, 2016

(65) Prior Publication Data
US 2017/0341240 A1    Nov. 30, 2017

(51) Int. Cl.
*H01L 21/677* (2006.01)
*H02P 29/00* (2016.01)
(Continued)

(52) U.S. Cl.
CPC ...... *H01L 21/67742* (2013.01); *B25J 9/1674* (2013.01); *G05B 9/02* (2013.01);
(Continued)

(58) Field of Classification Search
CPC ......... H01L 21/67742; H01L 21/67288; H02P 29/0241; H02P 29/00; B25J 9/1674; G05B 9/02; G05B 23/0232
See application file for complete search history.

(56) References Cited

U.S. PATENT DOCUMENTS 6,778,867 B1 *  8/2004  Ziegler .................. B25J 9/1674
                                                       318/563
8,036,776 B2 * 10/2011  Hellberg ................ B25J 9/1674
                                                       700/245
(Continued)

FOREIGN PATENT DOCUMENTS

CN      103177992 A      6/2013
JP      H07-100724 A     4/1995
(Continued)

OTHER PUBLICATIONS

Jul. 12, 2016 Office Action and Search Report issued in Taiwanese Patent Application No. 104124716.
(Continued)

*Primary Examiner* — Nicholas Kiswanto
(74) *Attorney, Agent, or Firm* — Oliff PLC

(57) ABSTRACT

A controller includes a control unit which stops a transfer mechanism in a case where the value of a deterioration indication parameter has exceeded a preset threshold, and determines whether or not an event in which the value of the deterioration indication parameter has exceeded the preset threshold is attributed to deterioration of the transfer mechanism which has progressed over time based on a change pattern of time series data of the value of the deterioration indication parameter, and causes the transfer mechanism to operate at a reduced operation speed, in a case where the control unit determines that the event in which the value of the deterioration indication parameter has exceeded the preset threshold is attributed to the deterioration of the transfer mechanism which has progressed over time.

12 Claims, 4 Drawing Sheets

(51) Int. Cl.
- *H01L 21/67* (2006.01)
- *G05B 23/02* (2006.01)
- *B25J 9/16* (2006.01)
- *H02P 29/024* (2016.01)
- *G05B 9/02* (2006.01)
- *G05B 19/406* (2006.01)

(52) U.S. Cl.
CPC ....... *G05B 19/406* (2013.01); *G05B 23/0232* (2013.01); *H01L 21/67288* (2013.01); *H02P 29/00* (2013.01); *H02P 29/0241* (2016.02)

(56) References Cited

U.S. PATENT DOCUMENTS

| | | | | |
|---|---|---|---|---|
| 8,090,475 | B2 * | 1/2012 | Blanc | B25J 9/1674 700/261 |
| 9,205,560 | B1 * | 12/2015 | Edsinger | B25J 9/1674 |
| 2013/0166064 | A1 | 6/2013 | Maki et al. | |
| 2017/0047237 | A1 * | 2/2017 | Kobata | H01L 21/32134 |

FOREIGN PATENT DOCUMENTS

| | | |
|---|---|---|
| JP | H10-313037 A | 11/1998 |
| JP | 2005-137127 A | 5/2005 |
| JP | 2005-311259 A | 11/2005 |
| JP | 2006-285688 A | 10/2006 |
| TW | 200809976 A | 2/2008 |
| TW | 201204619 A1 | 2/2012 |

OTHER PUBLICATIONS

Jun. 27, 2017 International Preliminary Report on Patentability issued in International Patent Application No. PCT/JP2014/006514.

Mar. 10, 2015 International Search Report issued in International Patent Application No. PCT/JP2014/006514.

* cited by examiner

CONTROLLER OF TRANSFER DEVICE

TECHNICAL FIELD

The present invention relates to a controller of a transfer device.

BACKGROUND ART

Examples of conventional techniques for determining deterioration of a transfer device are as follows. For example, Patent Literature 1 discloses a deterioration detecting device of a driving mechanism, which detects at least one of a position of a movable member of a motor and a current flowing through a driving source and determines a deterioration state of the driving mechanism based on at least one of a change in the detected position with respect to a target position of the movable member and the detected current.

Patent Literature 2 discloses a monitoring device of a substrate transfer system, which compares data corresponding to a target position of a movable member to data corresponding to an actual position of the movable member which is detected by a detecting means, finds a deviation between these data, and determines that the operation of the transfer system has an abnormality in a case where the deviation exceeds a predetermined allowable range.

CITATION LIST

Patent Literature

Patent Literature 1: Japanese Laid-Open Patent Application Publication No. 2005-311259
Patent Literature 2: Japanese Laid-Open Patent Application Publication No. Hei. 10-313037

SUMMARY OF INVENTION

Technical Problem

Conventionally, in a case where an abnormality of a transfer device is detected, the whole of a system including peripheral devices as well as the transfer device is shut down, thereafter an operator finds a cause of an error in the transfer device, and repairs the transfer device. For this reason, in a case where mechanical and electrical troubles occur in a transfer mechanism due to deterioration of the transfer mechanism which has progressed over time, the transfer device cannot be restored without an operator's work. This increases downtime of the transfer device.

An object of the present invention is to reduce downtime of the transfer device in a case where a trouble occurs in the transfer mechanism.

Solution to Problem

According to an aspect of the present invention, a controller of a transfer device, which drives a transfer mechanism by a servo motor while controlling a position of the servo motor, comprises an obtaining unit which obtains time series data of a value of a deterioration indication parameter which is at least one of a position gap of the servo motor in a position control for the servo motor and a current flowing through the servo motor; a memory unit which stores therein the obtained time series data of the value of the deterioration indication parameter; and a control unit which stops the transfer mechanism in a case where the value of the deterioration indication parameter has exceeded a preset threshold, and determines whether or not an event in which the value of the deterioration indication parameter has exceeded the preset threshold is attributed to deterioration of the transfer mechanism which has progressed over time based on a change pattern of the time series data of the value of the deterioration indication parameter, and causes the transfer mechanism to operate at a reduced operation speed, in a case where the control unit determines that the event in which the value of the deterioration indication parameter has exceeded the preset threshold is attributed to the deterioration of the transfer mechanism which has progressed over time. The position gap of the servo motor includes a difference (deviation) between a target value of the position of the servo motor in the position control and an actual value of the position of the servo motor, an offset (residual deviation) of the position of the servo motor, a deviation amount of the position of the servo motor from a reference position, or an inaccuracy of the position of the servo motor.

In general, in a case where the position gap or the value of the current of the servo motor gradually increases over time, it is highly probable that gears which operate in association with the servo motor of the transfer mechanism cannot rotate smoothly due to the deterioration of the transfer mechanism which has progressed over time, or grease has run out. In contrast, in a case where the position gap or the value of the current of the servo motor rapidly increases over time, it is highly probable that a collision of the transfer device against an obstacle, or a failure in the driving system, such as break of a gear, has occurred.

In accordance with the above-described configuration, the time series data of the value of the deterioration indication parameter which is at least one of the position gap of the servo motor in the position control and the current flowing through the servo motor is obtained and stored in the memory unit. In this way, the state of the transfer device can be monitored by the controller. In a case where the value of the deterioration indication parameter has exceeded the preset threshold, the control unit stops the transfer mechanism. This makes it possible to secure safety in a case where mechanical and electric troubles occur. The control unit determines whether or not the event in which the value of the deterioration indication parameter has exceeded the preset threshold is attributed to (caused by) the deterioration of the transfer mechanism which has progressed over time based on the change pattern of the time series data, and causes the transfer mechanism to operate at a reduced operation speed, in a case where the control unit determines that the event in which the value of the deterioration indication parameter has exceeded the preset threshold is attributed to the deterioration of the transfer mechanism which has progressed over time. In this way, the operation of the transfer device can be restored without intervention by the operator, even in a case where the mechanical and electric troubles occur due to the deterioration of the transfer mechanism which has progressed over time. Also, in the case of the error which can be avoided by reducing the operation speed of the transfer mechanism, the operation speed of the transfer mechanism is automatically reduced, and the transfer device is operated at the reduced operation speed. In this way, the downtime of the transfer device can be reduced.

The control unit may output an alarm signal in a case where the value of the deterioration indication parameter has exceeded the preset threshold, and the control unit may output an error signal in a case where the control unit determines that the event in which the value of the deterioration indication parameter has exceeded the preset threshold is not attributed to the deterioration of the transfer mechanism which has progressed over time.

In accordance with this configuration, since the operation state of the transfer device is surely transmitted to the operator who is present in the vicinity of the transfer system, the operator can take a proper measure. Specifically, in a case where the control unit outputs the alarm signal, the transfer device may be automatically restored. For this reason, the operator need not perform an operation for restoring the transfer device right away. For example, it is undesired that the operator enter semiconductor equipment under an environment which inhibits a person from entering the inside of the equipment or makes it difficult for the person to enter the inside of the equipment. In accordance with the above-described control, the operator need not enter the equipment until a regular maintenance for the transfer device is carried out. In contrast, in a case where the control unit outputs the error signal, the operator shuts down the whole of the system including peripheral devices such as the transfer device, a production line, and the like, and early finds a failure location based on the observed deviation, the observed current value, or the like. As a result, time required to repair the failure location can be reduced.

The change pattern of the time series data of the value of the deterioration indication parameter indicating the deterioration of the transfer mechanism which has progressed over time may be based on a change amount of the value of the deterioration indication parameter within a predetermined time.

In accordance with this configuration, the control unit can suitably determine whether or not the change pattern of the time series data of the parameter value is attributed to the deterioration of the transfer mechanism which has progressed over time.

The control unit may restore an operation of the transfer device in such a manner that the control unit reduces an operation speed of the transfer mechanism in a stepwise manner.

In accordance with this configuration, the operation of the transfer device can be easily restored.

The transfer device may be a multi-joint robot used under a vacuum environment.

Advantageous Effects of Invention

In accordance with the present invention, the downtime of the transfer device in a case where a trouble occurs in a transfer mechanism can be reduced.

The above and further objects, features and advantages of the present invention will more fully be apparent from the following detailed description of preferred embodiment with reference to the accompanying drawings.

DESCRIPTION OF EMBODIMENTS

Hereinafter, the embodiment of the present invention will be described with reference to the accompanying drawings. Throughout the drawings, the same or corresponding constituents are identified by the same reference symbols and will not be described repeatedly.

[Configuration]

Figure 1:
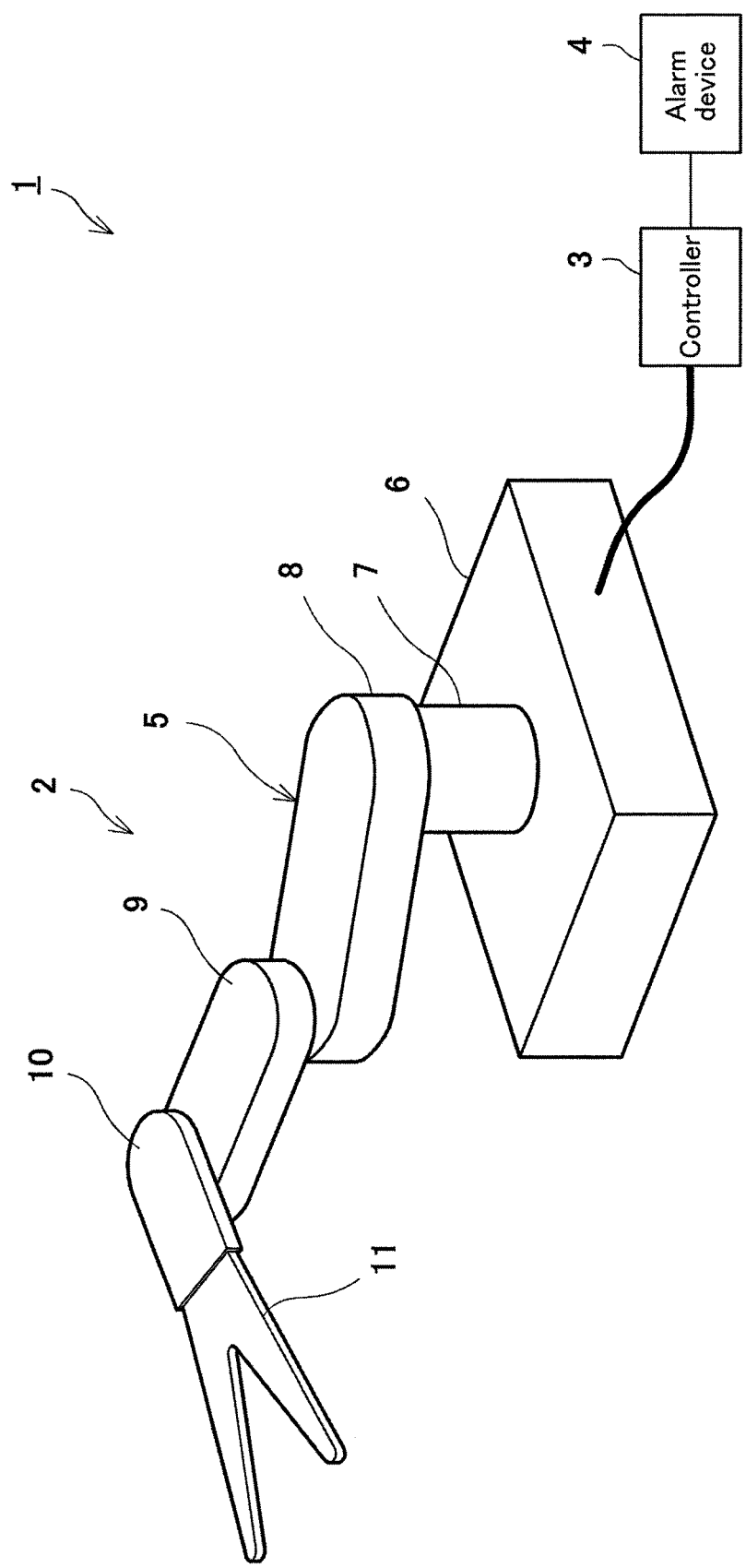
FIG. 1 is a schematic view showing the configuration of a transfer system according to the present embodiment.

FIG. 1 is a schematic view showing the configuration of a transfer system according to the present embodiment. As shown in FIG. 1, a transfer system 1 includes a transfer device 2, a controller 3 communicatively connected to the transfer device 2, and an alarm device 4 connected to the controller 3.

The transfer device 2 is not limited. It is sufficient that the transfer device 2 transfers (conveys) an object. The transfer device 2 is, for example, a Selective Compliance Assembly Robot Arm (SCARA) multi-joint (articulated) robot which transfers semiconductor wafers, glass substrates for display panels, etc., in semiconductor treatment equipment. A transfer mechanism 5 of the transfer device 2 includes an up-down shaft 7 provided on a base 6, a first link 8 provided on the up-down shaft 7, a second link 9 provided on the tip end portion of the first link 8, a third link 10 provided on the tip end portion of the second link 9, and an end effector 11 provided on the tip end portion of the third link 10. The constituents of the transfer mechanism 5 contain therein a plurality of servo motors (see FIG. 1) for driving them, respectively.

The controller 3 is configured to drive the transfer mechanism 5 by the plurality of servo motors contained in the transfer mechanism 5 while controlling the positions of the servo motors. The controller 3 includes, for example, a computer such as a microcontroller, and performs an operation for monitoring the state of the transfer mechanism 5, and an operation for automatically restoring the state of the transfer mechanism 5, which will be described later. The controller 3 is not limited to a single controller but may include a plurality of controllers.

The alarm device 4 notifies an operator who is present in the vicinity of the transfer system 1 that the transfer device 2 is in an alarm state or an error state. The alarm device 4 is controlled in accordance with an alarm signal or an error signal provided by the controller 3, and notifies the operator of the error by an alarm of light of PATLITE (registered mark) and a melody horn. Another notification means may be used to notify the operator of the error.

Figure 2:
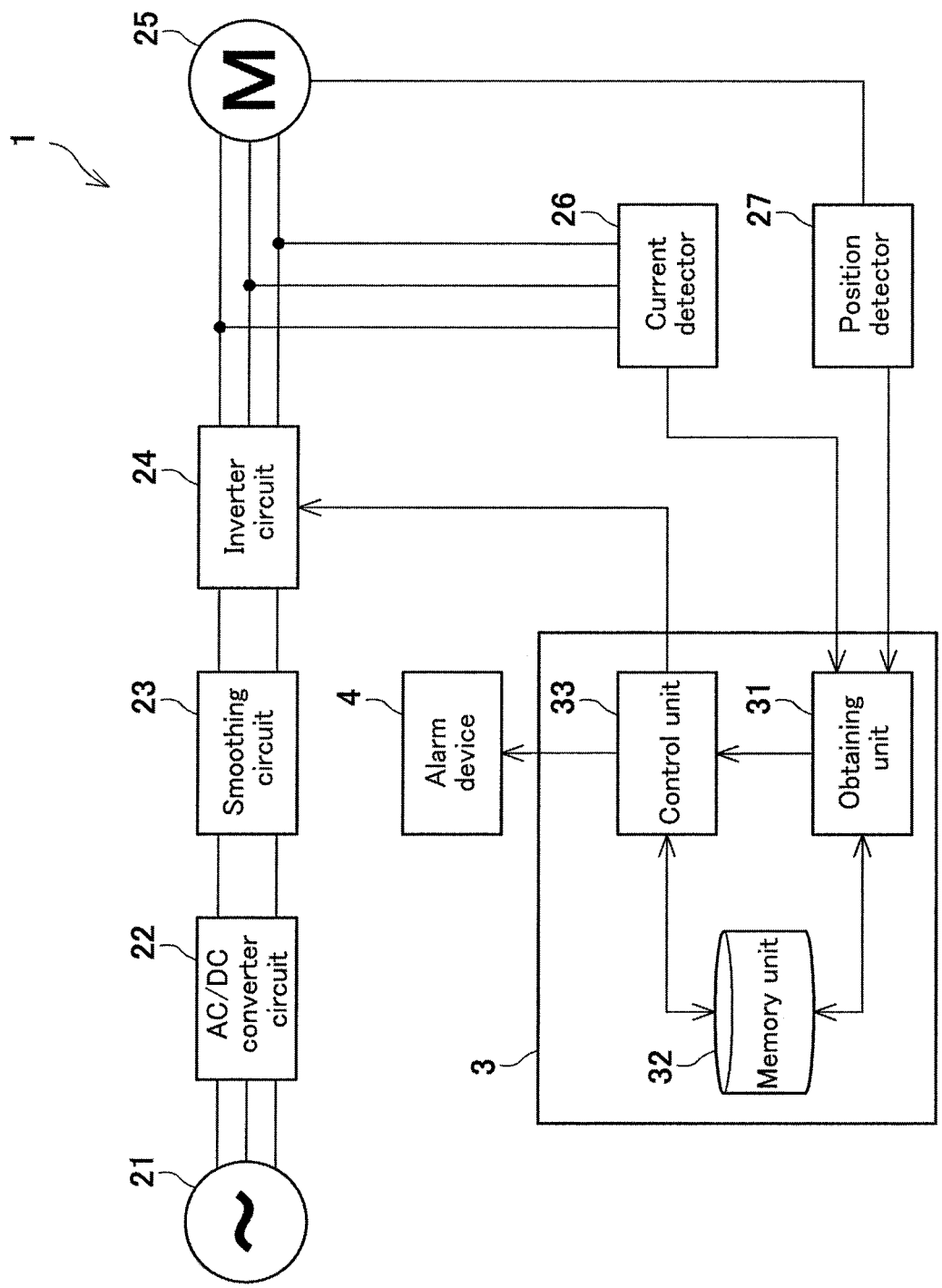
FIG. 2 is a block diagram showing a driving system and a control system of a transfer mechanism of FIG. 1.

FIG. 2 is a block diagram showing the configuration of a driving system and a control system of the transfer mechanism 5. As shown in FIG. 2, the driving system of the transfer mechanism 5 includes an AC/DC converter circuit 22 connected to an AC power supply 21, a smoothing circuit 23, an inverter circuit 24, a servo motor 25, a current detector 26, and a position detector 27. Although FIG. 2 shows only the driving system of one of the plurality of servo motors 25 contained in the transfer mechanism 5, the driving systems of the other servo motors 25 have the same configuration.

The AC power supply 21 is, for example, a three-phase AC power supply. The AC/DC converter circuit 22 is connected to the output terminal of the AC power supply 21, converts three-phase AC power output from the AC power supply 21 into DC power, and outputs the DC power to the smoothing circuit 23. The AC/DC converter circuit 22 is, for example, a three-phase full wave rectifier circuit.

The smoothing circuit 23 is connected to the output terminal of the AC/DC converter circuit 22, smooths a DC output voltage of the AC/DC converter circuit 22, and outputs the smoothed DC output voltage to the inverter circuit 24. The smoothing circuit 23 is, for example, a capacitor.

The inverter circuit 24 is connected to the output terminal of the smoothing circuit 23 and the output terminal of the controller 3. The inverter circuit 24 converts the DC power output from the smoothing circuit 23 into AC power in response to a control command received from the controller 3, and outputs a driving current to the servo motor 25. The inverter circuit 24 includes, for example, a three-phase bridge inverter circuit including 6 semiconductor switching elements, and a driving circuit for supplying a driving signal to a control terminal of each of the switching elements.

Each of the servo motors 25 drives the transfer mechanism 5 (see FIG. 1) by the driving current supplied from the inverter circuit 24. The servo motor 25 is, for example, a DC servo motor.

The current detector 26 is connected to the output terminal of the inverter circuit 24, detects the driving current of the servo motor 25, and outputs a detection signal to the controller 3. The driving current is a "load current" or an "armature current" of the servo motor 25.

The position detector 27 is attached on the servo motor 25, detects the position (rotational angle position of a rotor with respect to a reference rotational angle position) of the servo motor 25, and outputs the detected position of the servo motor 25 to the controller 3. The position detector 27 is, for example, an encoder or a resolver attached on the rotary shaft of the servo motor 25.

The controller 3 includes an obtaining unit 31 which receives the outputs of the detectors 26, 27, a memory unit 32 for storing information therein, a control unit 33 which controls the operation of the transfer device 2, and performs the operation for monitoring the state of the transfer mechanism 5 and the operation for automatically restoring the operation of the transfer mechanism 5, and an input/output interface (not shown). Control programs of the present embodiment are stored in the memory unit 32. The control unit 33 performs calculations in accordance with the control programs, to cause the transfer device 2 to perform a transfer operation, and perform the operation for monitoring the state of the transfer mechanism 5 and the operation for automatically restoring the transfer mechanism 5.

The obtaining unit 31 obtains the values of deterioration indication parameters which are a position gap of the servo motor 25 in a position control, and a current (driving current) flowing through the servo motor 25. The position gap of the servo motor 25 includes a difference (deviation) between a target value of the position of the servo motor 25 in the position control and an actual value of the position of the servo motor 25, an offset (residual deviation) of the position of the servo motor 25, a deviation amount of the position of the servo motor 25 from a reference position, or an inaccuracy of the position of the servo motor 25. The obtaining unit 31 calculates the position gap of the servo motor 25, from position information (the position of the servo motor 25) detected by the position detector 17 and a theoretical value of the position information. The obtaining unit 31 obtains the value of the current flowing through the servo motor 25, which is detected by the current detector 16.

The memory unit 32 stores therein time series data of the obtained values of the deterioration indication parameters, thresholds, and the like, in addition to the control programs. The memory unit 32 stores therein the position gaps calculated by the obtaining unit 31 and the currents obtained by the obtaining unit 31 as the time-series data (a group of parameter values arranged in time series) of the values of the deterioration indication parameters (see FIGS. 3A and 3B and 4A and 4B).

When the value of the deterioration indication parameter has exceeded a preset threshold, the control unit 33 stops the transfer mechanism 5, and determines whether or not an event in which the value of the deterioration indication parameter has exceeded the preset threshold is attributed to (caused by) the deterioration of the transfer mechanism 5 which has progressed over time, based on a change pattern of the time series data. In a case where the control unit 33 determines that the event in which the value of the deterioration indication parameter has exceeded the preset threshold is attributed to the deterioration of the transfer mechanism 5 which has progressed over time, the control unit 33 causes the transfer mechanism 5 to operate at a reduced operation speed.

[Operation]

Initially, the basic transfer operation of the transfer device 2 having the above-described configuration will be described. The controller 3 decides a current required to drive each of the servo motors 25 based on a position deviation of an actual measurement value detected by the position detector 27, from a positive command value of an operation path of the transfer device 2, generates a control command directing this current, and outputs the control command to the inverter circuit 14. Thus, the controller 3 transfers the substrate to a predetermined position in such a manner that the controller 3 causes the plurality of servo motors 25 (FIG. 2) contained in the transfer mechanism 5 (see FIG. 1) to drive the transfer mechanism 5 while controlling the positions of the servo motors 25 so that the positions of the servo motors 25 reach the position command values, respectively, by feedback control.

Figure 3A:
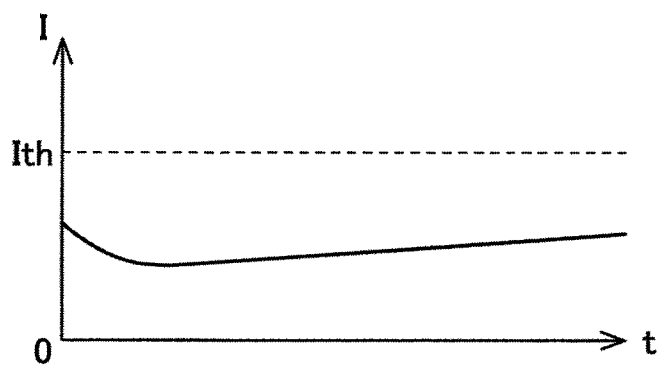
FIGS. 3A and 3B are schematic graphs showing changes over time of deterioration indication parameters stored in a controller of FIG. 2.
Figure 3B:
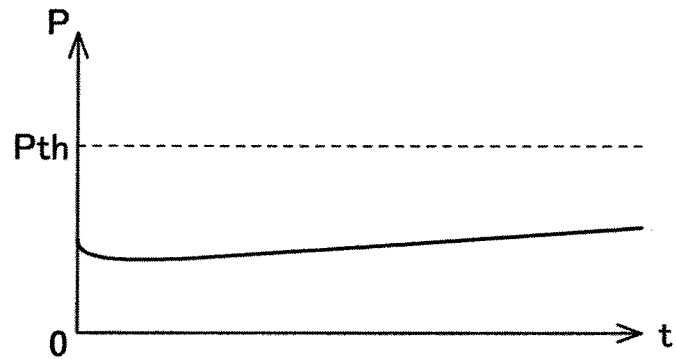

Next, a principle of the transfer mechanism (transfer device) state monitoring operation and the automatic restoring operation which are the features of the present invention will be described with reference to FIGS. 3A and 3B. FIGS. 3A and 3B are schematic graphs showing changes over time, of the deterioration indication parameters stored in the memory unit 32 of the controller 3. FIG. 3A shows a change over time of a value I of the current flowing through the servo motor 25. Herein, as the current value, for example, the current value in a case where the servo motor 25 is rotated at a predetermined rotational speed is stored in time series in the memory unit 32. For example, a current limit value $I_{th}$ is set based on characteristics of the servo motor 25.

FIG. 3B shows a change over time of a position gap P of the servo motor 25. As the position gap P, data indicating the amount of a deviation from a predetermined reference position, of the position of the servo motor 25 which is detected by the position detector 27 in a case where the command position of the servo motor 25 is the predetermined reference position is stored in time series in the memory unit 32. For example, a position gap threshold $P_{th}$ is set according to an accuracy of the position control. The time series data of the position gap P and the current value I for 5 years after the shipment of the transfer device 2 are stored in the memory unit 32.

As shown in FIG. 3A and 3B, the position gap P and the current value I of the servo motor 25 which are the deterioration indication parameters gradually increase over time. In a case where such a trend is maintained, it is highly probable that gears which operate in association with the servo motor 25 of the transfer mechanism 5 cannot rotate smoothly due to the deterioration of the transfer mechanism 5 which has progressed over time, or grease has run out, even in a case where the current value I has exceeded the current limit value $I_{th}$ or the position gap P has exceeded the position gap threshold $P_{th}$. If the operation speed of the transfer mechanism 5 is reduced, the current value can be reduced. In addition, if the position gap is compensated, a problem can be prevented. Therefore, the operation speed of the transfer mechanism 5 is reduced based on determination performed by software, and thereby the operation of the transfer device 2 can be continued.

Figure 4A:
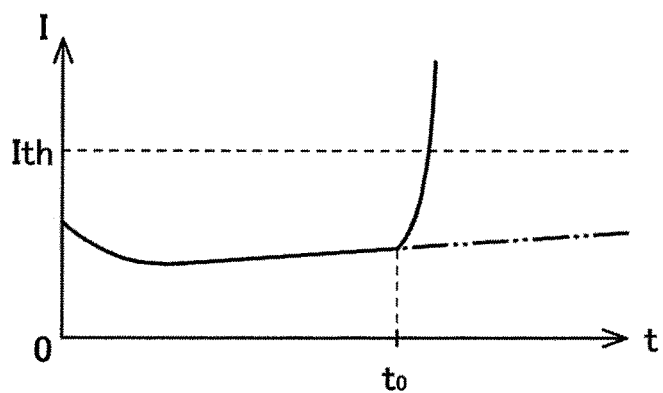
FIGS. 4A and 4B are schematic graphs showing changes over time of the deterioration indication parameters, in a case where a failure occurs in the states of FIGS. 3A and 3B.
Figure 4B:
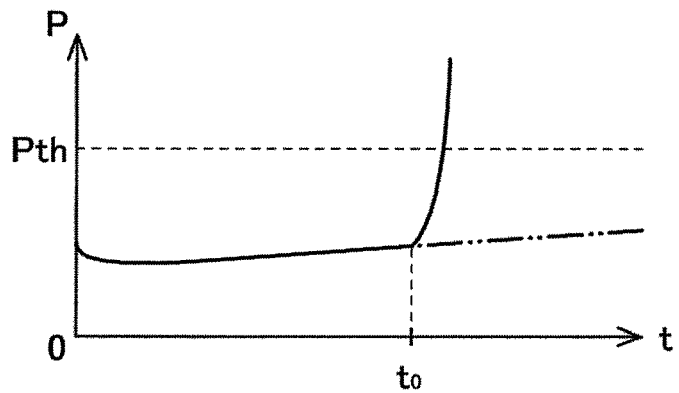

In contrast, FIGS. 4A and 4B are schematic graphs showing changes over time of the deterioration indication parameters, in a case where a failure occurs in the states of FIGS. 3A and 3B. FIGS. 4A and 4B correspond to FIGS. 3A and 3B, respectively. As shown in FIGS. 4A and 4B, the position gap P and the current value I which are the deterioration indication parameters rapidly increase, at time t0. In this case, it is highly probable that a collision of the transfer device 2 against an obstacle, or a failure in the driving system, such as break of a gear, has occurred. In other words, it is highly probable that a constituent such as the motor is broken. For this reason, it is difficult to continue the operation of the transfer device 2 based on the determination performed by software. A failure location can be found early based on the observed deviation, the observed current value, or the like, and time required to repair the failure location can be reduced.

Next, the transfer mechanism (transfer device) state monitoring operation and the automatic restoring operation which are performed by the controller 3 will be described with reference to the flowchart of FIG. 5.

Figure 5:
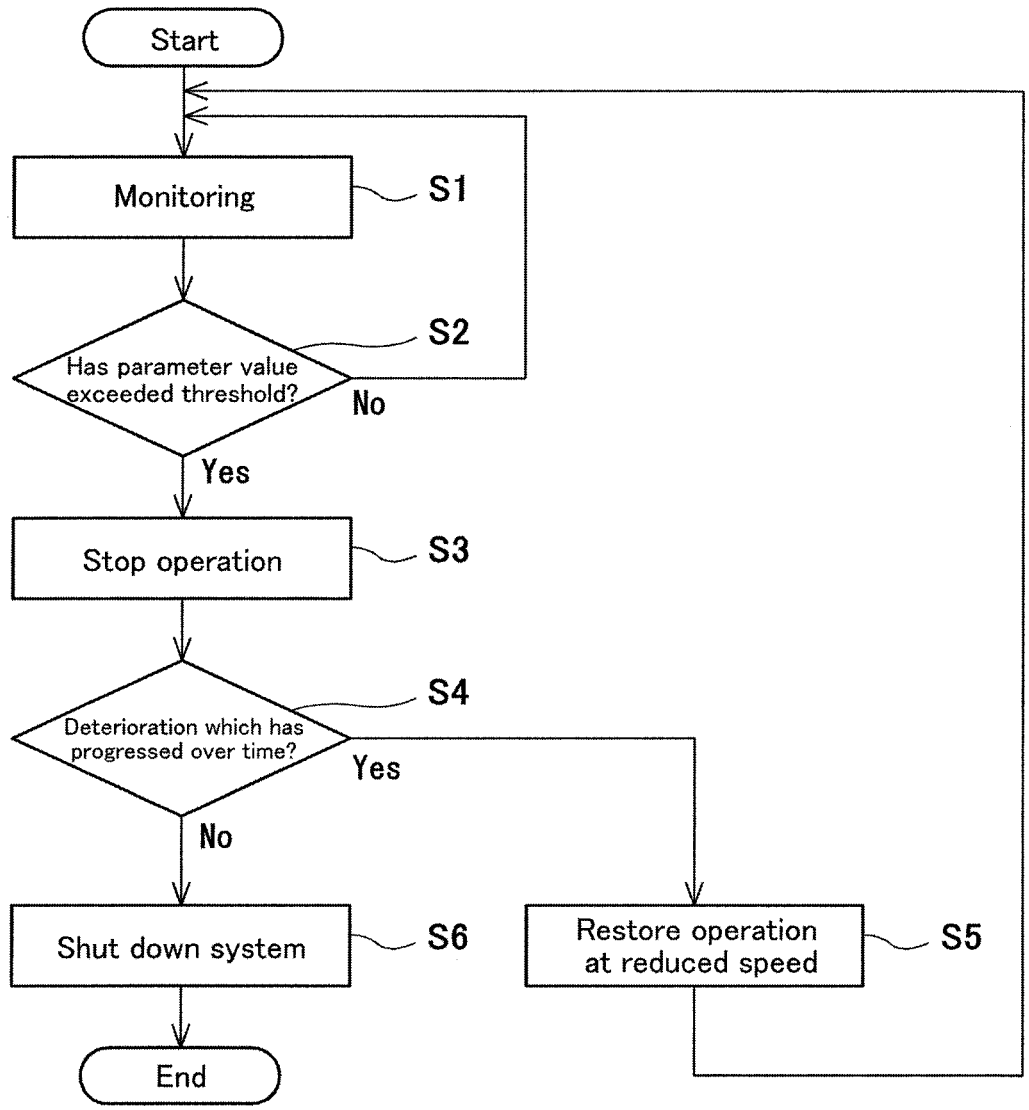
FIG. 5 is a flowchart for explaining a transfer mechanism (transfer device) state monitoring operation and an automatic restoring operation, which are performed by the controller of FIG. 2.

Initially, as shown in FIG. 5, the controller 3 monitors the deterioration indication parameters (step S1). The obtaining unit 31 obtains the time series data of the values of the deterioration indication parameters which are the position gap of the servo motor 25 in the position control and the current flowing through the servo motor 25. The obtained values of the deterioration indication parameters are stored in the memory unit 32 as the time series data. In this way, the state of the transfer device 2 can be monitored by the controller 3.

Then, the control unit 33 determines whether or not the value of the deterioration indication parameter has exceeded the preset threshold (step S2). The control unit 33 continues to monitor the value of the deterioration indication parameter until the value of the deterioration indication parameter has exceeded the preset threshold, and stops the transfer mechanism in a case where the value of the deterioration indication parameter has exceeded the preset threshold (step S3). This makes it possible to secure safety in a case where mechanical and electric troubles occur. At a time point when the value of the deterioration indication parameter has exceeded the preset threshold, the control unit 33 outputs an alarm signal to the alarm device 4. Receiving the alarm signal, the alarm device 4 notifies the operator who is present in the vicinity of the transfer system 1 that the transfer device 2 is in the alarm state. In a case where the control unit 33 outputs the alarm signal, the transfer device 2 may be automatically restored. For this reason, the operator need not perform an operation for restoring the transfer device 2 right away. In particular, it is undesired that the operator enter semiconductor equipment under a vacuum environment. In accordance with the above-described control, for example, the operator need not enter the equipment until a regular maintenance for the transfer device 2 is carried out.

After the control unit 33 has stopped the transfer mechanism 5, the control unit 33 determines whether or not the event in which the value of the deterioration indication parameter has exceeded the preset threshold is attributed to the deterioration of the transfer mechanism 5 which has progressed over time, based on the change pattern of the time series data (step S4). In the present embodiment, the change pattern of the time series data indicating the deterioration of the transfer mechanism 5 which has progressed over time is based on a change amount of the value of the deterioration indication parameter within a predetermined time. In this way, the control unit 33 can suitably determine whether or not the change pattern of the time series data indicates the deterioration of the transfer mechanism 5 which has progressed over time.

In a case where the control unit 33 determines that the event in which the value of the deterioration indication parameter has exceeded the preset threshold is attributed to the deterioration of the transfer mechanism 5 which has progressed over time, in step S4, the control unit 33 reduces the operation speed of the transfer mechanism 5 to the predetermined speed and restores the operation of the transfer device 2 (step S5). In this way, the operation of the transfer device 2 can be restored without intervention by the operator, even in a case where the mechanical and electric troubles occur due to the deterioration of the transfer mechanism 5 which has progressed over time. Also, in the case of the error which can be avoided by reducing the operation speed of the transfer mechanism 5, the operation speed of the transfer mechanism 5 is automatically reduced, and the transfer device 2 is operated at the reduced operation speed. In this way, the downtime of the transfer device 2 can be reduced.

In a case where the control unit 33 determines that the event in which the value of the deterioration indication parameter has exceeded the preset threshold is not attributed to the deterioration of the transfer mechanism 5 which has progressed over time, in step S5, the control unit 33 outputs the error signal to the alarm device 4, and shuts down the whole of the transfer system 1 (step S6). Receiving the error signal, the alarm device 4 notifies the operator who is present in the vicinity of the transfer system 1 that the transfer device 2 is in the error state. In response to this, the operator shuts down the whole of the system including peripheral devices such as the transfer device 2, a production line, and the like, and early finds a failure location based on the observed deviation, the observed current value, or the like. As a result, time required to repair the failure location can be reduced.

In accordance with the present embodiment, even in a case where the mechanical and electric troubles occur, the state of the transfer device 2 is monitored by the controller 3, and thereby slowness of the operation and the increases/decreases in the current and the voltage can be detected. Depending on the state of the transfer device 2, the control unit 33 outputs the error signal, or outputs a warning signal before the error actually occurs. In the case of the error which can be avoided by reducing the operation speed of the transfer mechanism 5, the operation speed of the transfer mechanism 5 is automatically reduced, and the transfer device 2 is operated at the reduced operation speed. In this way, the downtime of the transfer device 2 can be reduced.

Although in the present embodiment, the deterioration indication parameters are the position gap of the servo motor 25 in the position control and the current flowing through the servo motor 25, one of them may be used as the deterioration indication parameter. Further, the deterioration indication parameter may be a difference (gap) in the speed of the servo motor 25.

Although in the present embodiment, the controller 3 reduces the operation speed of the transfer mechanism 5 to the predetermined speed when the operation of the transfer device 2 is restored, the controller 3 may reduce the operation speed of the transfer mechanism 5 in a stepwise manner. For example, the controller 3 reduces the operation speed in a stepwise manner in the order of 100%, 50%, 25%, and 12.5% (stop), in a case where the value of the deterioration indication parameter is not restored. Thus, the operation of the transfer device 2 can be easily restored.

Numerous improvements and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention is effectively used in a transfer device which transfers semiconductor substrates or the like.

REFERENCE SIGNS LIST 1 transfer system
2 transfer device
3 controller
4 alarm device
5 transfer mechanism
6 base
7 up-down shaft
8 first link
9 second link
10 third link
11 end effector
21 AC power supply
22 AC/DC converter circuit
23 smoothing circuit
24 inverter circuit
25 servo motor
26 current detector
27 position detector
31 obtaining unit
32 memory unit
33 control unit

The invention claimed is:

1. A controller of a transfer device, which drives a transfer mechanism by a servo motor while controlling a position of the servo motor, the controller comprising:
  an obtaining unit which obtains time series data of a value of a deterioration indication parameter which is at least one of a position gap of the servo motor in a position control for the servo motor and a current flowing through the servo motor;
  a memory unit which stores therein the obtained time series data of the value of the deterioration indication parameter; and
  a control unit which:
    stops the transfer mechanism in a case where the value of the deterioration indication parameter has exceeded a preset threshold, and determines whether or not an event in which the value of the deterioration indication parameter has exceeded the preset threshold is attributed to deterioration of the transfer mechanism which has progressed over time based on a change pattern of the time series data of the value of the deterioration indication parameter, and
    causes the transfer mechanism to operate at a reduced operation speed, in a case where the control unit determines that the event in which the value of the deterioration indication parameter has exceeded the preset threshold is attributed to the deterioration of the transfer mechanism which has progressed over time, wherein:
  the control unit outputs an alarm signal in a case where the value of the deterioration indication parameter has exceeded the preset threshold, and
  the control unit outputs an error signal in a case where the control unit determines that the event in which the value of the deterioration indication parameter has exceeded the preset threshold is not attributed to the deterioration of the transfer mechanism which has progressed over time.

2. The controller of the transfer device according to claim 1, wherein the change pattern of the time series data of the value of the deterioration indication parameter indicating the deterioration of the transfer mechanism which has progressed over time is based on a change amount of the value of the deterioration indication parameter within a predetermined time.

3. The controller of the transfer device according to claim 1, wherein the transfer device is a multi-joint robot used under a vacuum environment.

4. A controller of a transfer device, which drives a transfer mechanism by a servo motor while controlling a position of the servo motor, the controller comprising:
  an obtaining unit which obtains time series data of a value of a deterioration indication parameter which is at least one of a position gap of the servo motor in a position control for the servo motor and a current flowing through the servo motor;
  a memory unit which stores therein the obtained time series data of the value of the deterioration indication parameter; and
  a control unit which:
    stops the transfer mechanism in a case where the value of the deterioration indication parameter has exceeded a preset threshold, and determines whether or not an event in which the value of the deterioration indication parameter has exceeded the preset threshold is attributed to deterioration of the transfer mechanism which has progressed over time based on a change pattern of the time series data of the value of the deterioration indication parameter, and
    causes the transfer mechanism to operate at a reduced operation speed, in a case where the control unit determines that the event in which the value of the deterioration indication parameter has exceeded the preset threshold is attributed to the deterioration of the transfer mechanism which has progressed over time, wherein:
  in a case where the control unit determines that the event in which the value of the deterioration indication parameter has exceeded the preset threshold is attributed to the deterioration of the transfer mechanism which has progressed over time, the reduced operation speed at which the transfer mechanism is caused to operate is set in a stepwise manner such that the operation speed becomes lower each time the transfer mechanism is stopped due to the event in which the value of the deterioration indication parameter has exceeded the preset threshold.

5. The controller of the transfer device according to claim 4, wherein the change pattern of the time series data of the value of the deterioration indication parameter indicating the deterioration of the transfer mechanism which has progressed over time is based on a change amount of the value of the deterioration indication parameter within a predetermined time.

6. The controller of the transfer device according to claim 4, wherein the transfer device is a multi-joint robot used under a vacuum environment.

7. A controller for a transfer device, which drives a transfer mechanism by a servo motor while controlling a position of the servo motor, the controller comprising:
an interface that obtains time series data of a value of a deterioration indication parameter which is at least one of: (i) a position gap of the servo motor in a position control for the servo motor, and (ii) a current flowing through the servo motor;
a memory storing the obtained time series data of the value of the deterioration indication parameter; and
at least one microcontroller programmed to:
when the value of the deterioration indication parameter has exceeded a preset threshold, stop the transfer mechanism,
determine whether or not an event in which the value of the deterioration indication parameter has exceeded the preset threshold is attributed to deterioration of the transfer mechanism which has progressed over time based on a change pattern of the time series data of the value of the deterioration indication parameter, and
when the value of the deterioration indication parameter has exceeded the preset threshold is determined as being attributed to the deterioration of the transfer mechanism which has progressed over time, cause the transfer mechanism to operate at a reduced operation speed, wherein:
the at least one microcontroller is further programmed to:
output an alarm signal in a case where the value of the deterioration indication parameter has exceeded the preset threshold, and
when the value of the deterioration indication parameter has exceeded the preset threshold is determined as not being attributed to the deterioration of the transfer mechanism which has progressed over time, output an error signal.

8. The controller of the transfer device according to claim 7, wherein the change pattern of the time series data of the value of the deterioration indication parameter indicating the deterioration of the transfer mechanism which has progressed over time is based on a change amount of the value of the deterioration indication parameter within a predetermined time.

9. The controller of the transfer device according to claim 7, wherein the transfer device is a multi-joint robot used under a vacuum environment.

10. A controller for a transfer device, which drives a transfer mechanism by a servo motor while controlling a position of the servo motor, the controller comprising:
an interface that obtains time series data of a value of a deterioration indication parameter which is at least one of: (i) a position gap of the servo motor in a position control for the servo motor, and (ii) a current flowing through the servo motor;
a memory storing the obtained time series data of the value of the deterioration indication parameter; and
at least one microcontroller programmed to:
when the value of the deterioration indication parameter has exceeded a preset threshold, stop the transfer mechanism,
determine whether or not an event in which the value of the deterioration indication parameter has exceeded the preset threshold is attributed to deterioration of the transfer mechanism which has progressed over time based on a change pattern of the time series data of the value of the deterioration indication parameter, and
when the value of the deterioration indication parameter has exceeded the preset threshold is determined as being attributed to the deterioration of the transfer mechanism which has progressed over time, cause the transfer mechanism to operate at a reduced operation speed, wherein:
when the event in which the value of the deterioration indication parameter has exceeded the preset threshold is attributed to the deterioration of the transfer mechanism which has progressed over time, the at least one microcontroller causes the reduced operation speed at which the transfer mechanism to operate is set in a stepwise manner such that the operation speed becomes lower each time the transfer mechanism is stopped due to the event in which the value of the deterioration indication parameter has exceeded the preset threshold.

11. The controller of the transfer device according to claim 10, wherein the change pattern of the time series data of the value of the deterioration indication parameter indicating the deterioration of the transfer mechanism which has progressed over time is based on a change amount of the value of the deterioration indication parameter within a predetermined time.

12. The controller of the transfer device according to claim 10, wherein the transfer device is a multi-joint robot used under a vacuum environment.

* * * * *